(12) United States Patent
Zhang et al.

(10) Patent No.: US 6,737,674 B2
(45) Date of Patent: May 18, 2004

(54) SEMICONDUCTOR DEVICE AND FABRICATION METHOD THEREOF

(75) Inventors: Hongyong Zhang, Atsugi (JP); Hideto Ohnuma, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/123,210

(22) Filed: Apr. 17, 2002

(65) Prior Publication Data

US 2002/0110965 A1 Aug. 15, 2002

Related U.S. Application Data

(62) Division of application No. 09/805,254, filed on Mar. 14, 2001, now Pat. No. 6,383,852, which is a division of application No. 09/115,839, filed on Jul. 15, 1998, now Pat. No. 6,204,154.

(30) Foreign Application Priority Data

Jul. 16, 1997 (JP) ............................................. 9-207177

(51) Int. Cl.$^7$ ............................................. H01L 29/04
(52) U.S. Cl. ........................................................ 257/64
(58) Field of Search ......................... 257/64, 66, 72, 257/347, 352, 59, 69; 438/166

(56) References Cited

U.S. PATENT DOCUMENTS

| | | |
|---|---|---|
| 5,488,000 A | 1/1996 | Zhang et al. |
| 5,700,333 A | 12/1997 | Yamazaki et al. |
| 5,843,225 A | 12/1998 | Takayama et al. |
| 5,915,174 A | 6/1999 | Yamazaki et al. |
| 5,956,579 A | 9/1999 | Yamazaki et al. |
| 5,961,743 A | 10/1999 | Yamazaki et al. |
| 5,977,559 A | 11/1999 | Zhang et al. |
| 5,986,306 A | 11/1999 | Nakajima et al. |
| 6,013,544 A * | 1/2000 | Makita et al. ............... 438/166 |
| 6,072,193 A | 6/2000 | Ohnuma et al. |
| 6,162,667 A * | 12/2000 | Funai et al. ................. 438/166 |
| 6,204,154 B1 | 3/2001 | Zhang et al. |

* cited by examiner

*Primary Examiner*—Huan Hoang
*Assistant Examiner*—Quoc Hoang
(74) *Attorney, Agent, or Firm*—Eric J. Robinson; Robinson Intellectual Property Law Office, P.C.

(57) ABSTRACT

There is provided a method for eliminating influence of nickel element from a crystal silicon film obtained by utilizing nickel. A mask made of a silicon oxide film is formed on an amorphous silicon film. Then, the nickel element is held selectively on the surface of the amorphous silicon film by utilizing the mask. Next, a heat treatment is implemented to grow crystal. This crystal growth occurs with the diffusion of the nickel element. Next, phosphorus is doped to a region by using the mask. Then, another heat treatment is implemented to remove the nickel element from the pattern under the mask through the course reverse to the previous course in diffusing the nickel element in growing crystal. Then, the silicon film is patterned by utilizing the mask again to form a pattern. Thus, the pattern of the active layer which has high crystallinity and from which the influence of the nickel element is removed may be obtained without increasing masks in particular (i.e. without complicating the process).

22 Claims, 5 Drawing Sheets

SEMICONDUCTOR DEVICE AND FABRICATION METHOD THEREOF

BACKGROUND OF THE INVENTION

1. Field of the Invention

The invention disclosed in the present specification relates to a thin film transistor using a crystal silicon film and a fabrication method thereof. The invention also relates to a device utilizing such a thin film transistor and a fabricating method thereof.

2. Description of Related Art

Hitherto, there has been known a thin film transistor (hereinafter referred to as TFT) using an amorphous silicon film. It is mainly used for constructing an active matrix circuit of an active matrix liquid crystal display.

However, the TFT using the amorphous silicon film has had a drawback that its operation speed is slow and that a P-channel type TFT cannot be put into practical use. Then, due to such problems, it was unable to fabricate an active matrix liquid crystal display to which a peripheral driving circuit is integrated or to construct various integrated circuits using the TFT.

As a solution of this problem, there has been known a scheme of using a crystal silicon film. The crystal silicon film may be fabricated by heating or by irradiating laser light.

However, the heating method has had a problem that a glass substrate cannot be used because it requires a high temperature process of 900° C. or more. Considering that the main field of application of the TFT is a liquid crystal display, it is a preferential subject to be able to use the glass substrate as the substrate.

Meanwhile, although the method of irradiating laser light can realize a process through which no thermal damage is given to the substrate, it is not satisfactory in terms of the crystal uniformity and reproducibility and of the degree of crystallization.

As one of solutions of such problems, there has been a method of promoting the crystallization by using a predetermined metal element, i.e. the inventive method which the present applicants have proposed. According to this method, a crystal silicon film is obtained by introducing metal element typified by nickel to the amorphous silicon film and by implementing a heat treatment. This method allows the crystal silicon film having good crystallinity to be obtained while implementing the heat treatment below about 600° C. which permits to use the glass substrate.

However, because the nickel element remains within the crystal silicon film, the characteristic of the TFT fabricated by using the crystal silicon film is influenced adversely. In concrete, it causes problems that the characteristic changes as time elapses, thus degrading the reliability.

Accordingly, it is an object of the invention disclosed in the present specification to provide a technology for suppressing the metal element from adversely influencing the characteristic of the TFT fabricated by using the crystal silicon film obtained by utilizing the metal element which promotes the crystallization of silicon.

SUMMARY OF THE INVENTION

One of the invention disclosed in the present specification features a semiconductor device comprising an active layer having a crystal structure in which crystal growth has proceeded from the whole periphery and a semiconductor device utilizing a semiconductor element having such structure.

The structure as described above may be obtained by growing crystal by diffusing nickel 105 from a periphery 201 of a pattern which turns out to be an active layer as shown in FIG. 1 and by causing phosphorus doped to a region 108 outside of the pattern to getter nickel element as shown in FIG. 2.

The crystal structure continues in the direction 105 in FIG. 1 and in the direction 110 in FIG. 2 and a crystal boundary extends along that direction. It may be confirmed by observing through an optical microscope or by TEM (transmission type electronic microscope).

Another scheme of the invention pertains to a fabrication method of a semiconductor device, comprising steps of diffusing metal element promoting crystallization of silicon from the whole periphery of a predetermined region of an amorphous silicon film within the region to grow crystal and of removing the metal element out of the region by following the course reverse to the diffusing course.

This scheme features the steps of growing crystal by diffusing nickel element from the periphery as shown in FIG. 1B-1 and of moving (removing) the nickel element to the periphery as shown in FIG. 2A-1.

The diffusion of the nickel element plays an important role in the crystallization. However, it is not desirable for the nickel element to remain within the crystal silicon film thus obtained. Then, it becomes important how to remove the nickel element effectively.

The course for removing the nickel element to the periphery of the pattern as shown in FIG. 2A-1 is reverse to the course of diffusing the nickel element during the crystallization. Because this course has become a course for moving the nickel element once, its energy level is minimized as a course for moving nickel. That is, it has become a course where the hindrance is least for moving nickel. It is irrelevant to the moving direction of nickel.

Accordingly, the nickel element moves following the most effective course for removing the nickel element as shown in FIG. 2A-1.

Another scheme of the invention pertains to a fabrication method of a semiconductor device, comprising steps of forming a mask on an amorphous silicon film; selectively doping metal element which promotes crystallization of silicon to the amorphous silicon film by utilizing the mask; implementing a heat treatment to grow crystal from the region where the metal element has been introduced to the lower part of the mask in the amorphous silicon film; selectively introducing an element in the XV group to the silicon film by using the mask; implementing a heat treatment to move the metal element to the region where the element in the XV group has been doped; and removing the region where the element in the XV group has been doped.

As the metal element promoting the crystallization of silicon in the present invention, one or a plurality of kinds of elements selected among Fe, Co, Ni, Ru, Rh, Pd, Os, Ir, Pt, Cu, Au, Ge, Pb and In may be utilized. The better effect and the high reproducibility may be obtained when Ni is used in particular.

An element selected among P, As and Ab is utilized as the element of the XV group. The better effect may be obtained when P (phosphorus) is used in particular.

In concrete, a mask 103 made of a silicon oxide film is formed on an amorphous silicon film 102 at first as shown in FIG. 1A. Then, nickel element is held selectively on the surface of the amorphous silicon film 102 by utilizing the mask 103. This process corresponds to the introduction of nickel element.

While there are sputtering, CVD, plasma treatment, ion implantation and the like as methods for introducing nickel element, the method of using a solution is simplest.

Next, a heat treatment is implemented to grow crystal as indicated by arrows (105) in FIG. 1B-1. This crystal growth occurs with the diffusion of nickel element.

Next, phosphorus is introduced as shown in FIG. 1C by means of plasma doping or ion implantation. Phosphorus is doped to a region 108 by using the mask 103 in this step.

Then, another heat treatment is implemented to remove the nickel element from the pattern under the mask 103 by following the course as indicated by arrows 110 reverse to the previous course of diffusing the nickel element in growing the crystal as shown in FIG. 2A-1.

Then, the nickel element is removed by gettering nickel to the region where phosphorus has been doped.

Then, the silicon film is patterned by utilizing the mask 103 again to form a pattern 111.

Thus, the pattern of the active layer which has high crystallinity and from which the influence of the nickel element has been removed may be obtained without increasing masks in particular (i.e. without complicating the process).

The specific nature of the invention, as well as other objects, uses and advantages thereof, will clearly appear from the following description and from the accompanying drawings in which like numerals refer to like parts.

DESCRIPTION OF PREFERRED EMBODIMENTS

First Embodiment

Figure 1A:
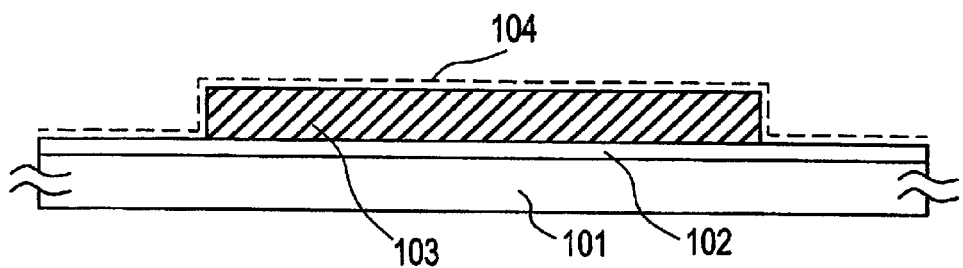
FIGS. 1A through 1C are diagrammatic views showing steps for fabricating a TFT.
Figure 1B:
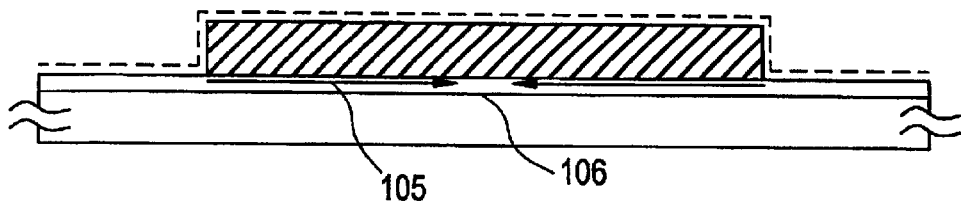
Figures 1, 1B:
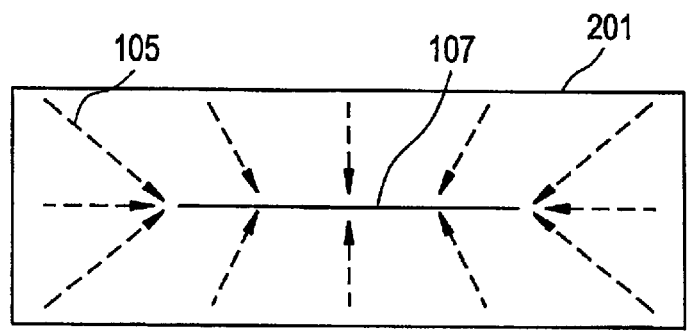
Figure 1C:
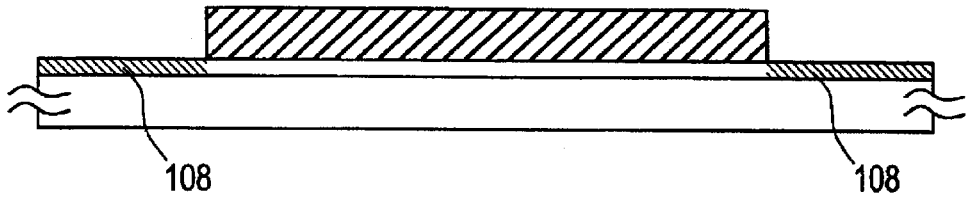

FIGS. 1A through 1C show steps for fabricating a semiconductor device according to the present embodiment. At first, an amorphous silicon film 102 is formed on a glass substrate 101 in thickness of 50 nm by means of reduced pressure thermal CVD.

Although plasma CVD may be used as a method for forming the amorphous silicon film, it is preferable, when the later crystallization step is considered, to adopt the reduced pressure thermal CVD which allows a content of hydrogen to be reduced.

Corning 1737 glass substrate whose distortion point is 667° C. is used as the glass substrate in the present embodiment Although the case of forming the amorphous silicon film directly on the surface of the glass substrate is exemplified in the present embodiment, a silicon oxide film, a silicon oxide nitride film or a silicon nitride film may be formed as an underlying film on the surface of the glass substrate depending on the surface condition thereof or on types and concentration of impurity contained therein.

After forming the amorphous silicon film 102, a mask 103 made of a silicon oxide film having a thickness of 150 nm is formed. A silicon nitride film, a silicon oxide nitride film and the like may be also used as the material of the mask 103. The material of the mask 103 must be what can sustain a heat treatment implemented later.

Next, a nickel acetate solution which has been prepared so as to have predetermined nickel concentration is applied to obtain a state in which nickel element is held in contact with the surface of the specimen as indicated by the reference numeral (104). The nickel acetate solution which has been prepared to have concentration of 10 ppm in terms of weight is used in the present embodiment. Thus, the state shown in FIG. 1A is obtained.

As another method for introducing nickel, there is a method of forming a film containing nickel by means of sputtering or CVD. Further, a method by means of electric discharge using an electrode containing nickel or ion implantation may be used.

Next, a heat treatment is implemented for eight hours at 590° C. within nitrogen atmosphere. This heat treatment is implemented by using a heating furnace equipped with a resistance heating heater. It is noted that the heat treatment may be implemented by irradiating infrared rays.

The nickel element diffuses in the direction of arrows 105 and thereby crystallization proceeds in this step. That is, the diffusion of nickel and the crystallization proceed in the direction of the arrows 105. This heat treatment may be implemented within a range from 500° C. to a distortion point of the glass substrate.

FIG. 1B is a section view showing this state of crystal growth. FIG. 1B-1 is a plan view showing this state seen from the above.

In FIG. 1B-1, part 107 is the part where edge portions of the grown crystal collide. A crystal boundary is formed in this part. A peripheral portion 201 of the mask 103 shown in FIG. 1B-1 coincides with a pattern of an active layer which is to be formed later.

After finishing the crystallization, P (phosphorus) is doped by means of plasma doping or ion implantation.

The plasma doping is a method which involves no mass separation and which draws out dopant ions by electric field directly from atmosphere of plasma of material gas and accelerates and implants them.

The ion implantation is a method of selecting ions drawn out of the atmosphere of plasma of the material gas by means of mass separating using magnetic field and of accelerating and implanting them.

Phosphorus is doped to regions 108 under the dose condition that average concentration thereof is higher than the concentration of nickel existing within the film (FIG. 1C).

Next, a heat treatment is implemented at 620° C. for two hours within nitrogen atmosphere. The temperature of the heat treatment is selected from a range from 450° C. to 750° C. (generally, the upper limit thereof is decided by the distortion point of the glass substrate). The higher the temperature, the better the effect obtained is as a matter of course. It is noted that this heat treatment may be implemented by irradiating infrared rays.

Figure 2A:
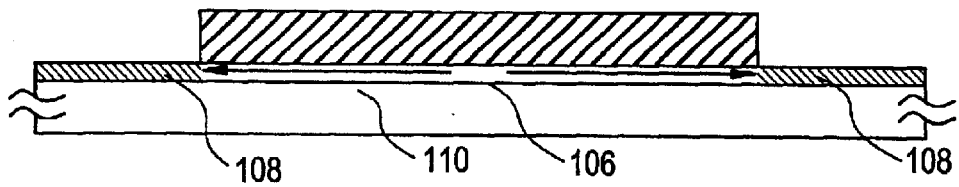
FIGS. 2A through 2D are diagrammatic views showing steps for fabricating the TFT.
Figures 1, 2A:
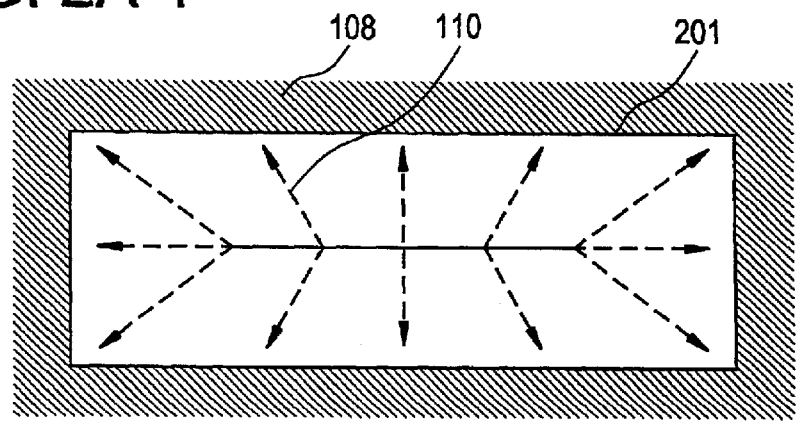

In this step, the nickel element moves in along the course indicated by the arrows 110 shown in FIGS. 2A and 2A-1, because the phosphorus doped to the region 108 couples with nickel and they are fixed there. Nickel actively moves across a distance of several tens $\mu$m or more in the heat treatment at 620° C. Meanwhile, phosphorus barely moves (it is necessary to heat up to 800° C. or more for phosphorus to move).

Phosphorus couples with nickel in various ways and the coupling state is very stable. Accordingly, the nickel element which has moved within the film and coupled with phosphorus will not move from there (the region 108). As a result, a state as if nickel has moved to the region 108 and has been fixed there is obtained.

The moving course 110 of the nickel element within the crystal silicon film 106 is the course reverse to the previous moving course of the nickel element during the crystallization.

Because the moving course of the nickel element in the steps in FIGS. 2A and 2A-1 is the course where the nickel element has moved once before, it is in the state in which the nickel element can readily move (there is less hindrance for nickel to move).

It is supported by the fact that when an experiment is carried out by differentiating the moving course of nickel during the crystallization from the moving course of nickel in the nickel removing stage, it is observed that the move of nickel in the latter moving stage is clearly hampered.

Because the mask 103 decides the pattern of the active layer of the TFT to be formed later, its size is the same with that of the active layer of the TFT.

Accordingly, the moving course of the nickel element in the step shown in FIGS. 2A and 2A-1 is several $\mu$m at most.

According to fundamental experiments, it has been found that the greater the ratio between an area of the region where phosphorus has been doped and an area from which nickel is removed, the higher the nickel removing effect is and the shorter the moving course of nickel, the higher the nickel removing effect is.

Accordingly, the area of the region which is masked by the mask 104 is preferable to be small.

Thus, the present embodiment has the structure suitable for removing nickel in terms of the subjects of the moving course of nickel and of the moving distance thereof. This is advantageous also when the sub-micronization of devices proceeds from now on.

When the step shown in FIGS. 2A and 2(A-1) ends, the nickel element concentrates in the region 108. That is, the concentration of the nickel element within the region which is defined by an outer periphery 201 reduces and the concentration of nickel in the region 108 around that region increases.

Next, the exposed region of the silicon film 106 is removed by using the mask 103. This step is a step of forming the active layer pattern 111 of the TFT from the silicon film 106.

Figure 2B:
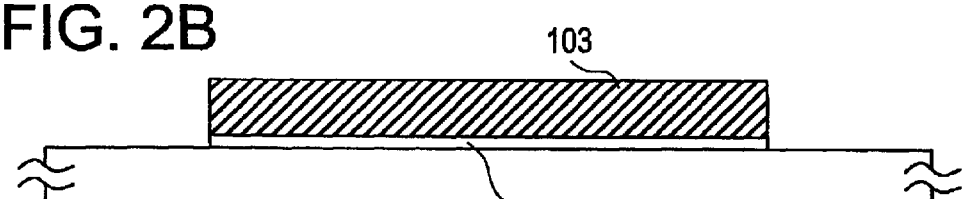
Figure 2C:
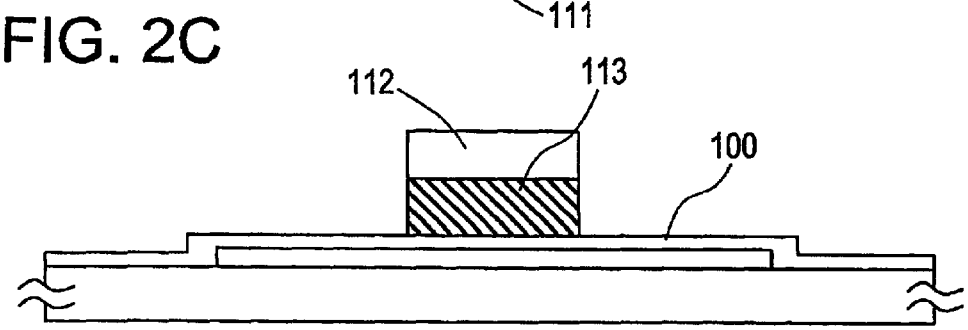

Thus, the state shown in FIG. 2B is obtained. Next, the mask 103 made of the silicon oxide film is removed. Then, a silicon oxide film 100 is formed in a thickness of 100 nm as a gate insulating film by means of plasma CVD as shown in FIG. 2C.

Further, an aluminum film not shown is formed in a thickness of 400 nm by means of sputtering. Then, a resist mask 112 is formed on the aluminum film. Next, the aluminum film not shown is patterned by using the resist mask 112 to form an aluminum pattern 113 as shown in FIG. 2C.

Next, anodic oxidation is implemented by setting the pattern 113 as an anode while leaving the resist mask 112. Here, an anodic oxide film 114 is formed in a thickness of 500 nm. Because the resist mask 112 exists in this step, the anodic oxide film 114 grows selectively on the side face of the aluminum pattern 113.

This step for growing the anodic oxide film is implemented by using 3 vol. % of oxalic acid aqueous solution as an electrolyte and by setting the aluminum pattern as the anode and platinum as the cathode. The anodic oxide film formed in this step is porous (FIG. 2D).

Next, the resist mask 112 is removed and anodic oxidation is implemented again. In this step, an ethylene glycol solution containing 3 vol. % of tartaric acid and neutralized by aqueous ammonia is used as an electrolyte.

Figure 2D:
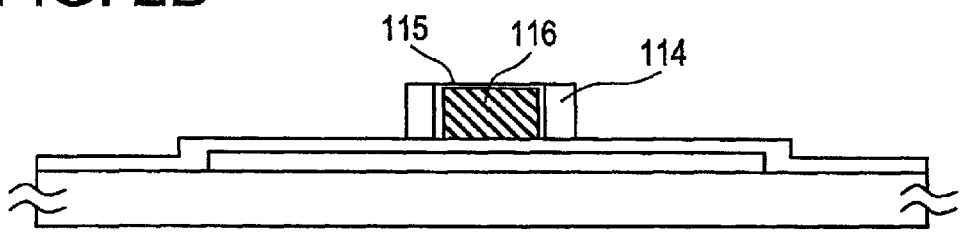

In this step, because the electrolyte infiltrates to the porous anodic oxide film 114, an anodic oxide film 115 in the state as shown in FIG. 2D is formed. The anodic oxide film 115 formed in this step has a dense film quality. The thickness of the dense anodic oxide film 115 is 70 nm.

Here, the aluminum pattern which is left without being anodized becomes a gate electrode 116 as shown in FIG. 2D.

Figure 3A:
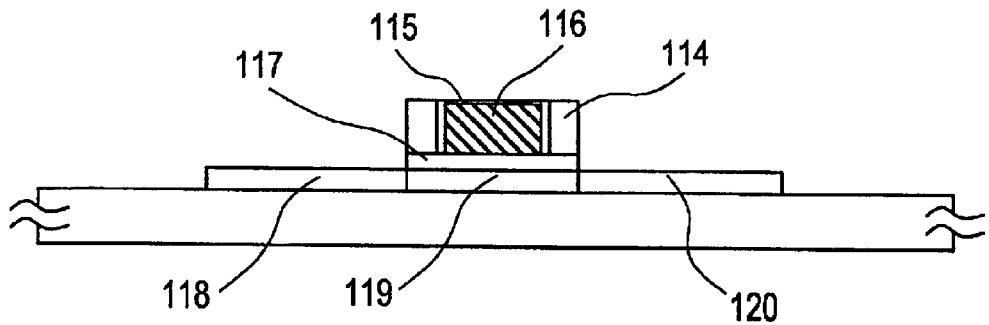
FIGS. 3A through 3C are diagrammatic views showing steps for fabricating the TFT.

Next, the exposed silicon oxide film 100 is removed by means of dry etching having vertical anisotropy. Thus, the state as shown in FIG. 3A is obtained. Here, the silicon oxide film left functions as a gate insulating film 117.

Next, phosphorus is doped by means of plasma doping or ion implantation to regions 118 and 120. These regions will be called high concentrate impurity regions for convenience. It is noted that no phosphorus is doped to a region 119 (FIG. 3A). This doping step is implemented under the condition of forming normal source and drain regions.

Figure 3B:
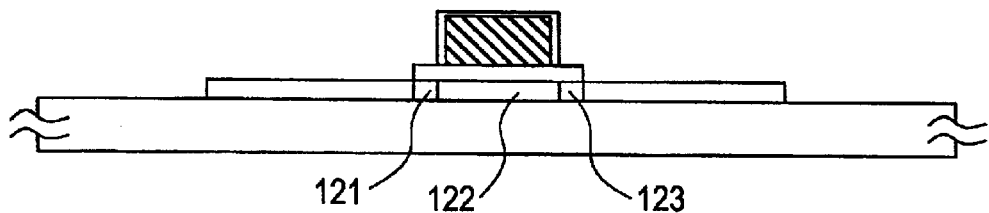

Next, the porous anodic oxide film 114 is removed selectively to obtain the state shown in FIG. 3B.

Then, phosphorus is doped again. Here, the doping is implemented while lowering the dose more than that of the doping in the previous step in FIG. 3A by one digit.

In this step, phosphorus is doped to regions 121 and 123. These regions will be called as low concentrate impurity regions because the doping is implemented with the lower dose as compared to the regions 118 and 120 (FIG. 3B).

Among the low concentrate impurity regions, the drain side region 123 functions as an LDD (light doped drain).

Then, the region 122 is defined as a channel region. It is noted that although a high resistant region called an offset region is formed by the thickness of the anodic oxide film 115 adjacent to the channel region 122, its existence is neglected in the present embodiment because the thickness of the anodic oxide film 115 is as thin as 70 nm.

After finishing the doping, laser light is irradiated to anneal the damage of the doped region and to activate the dopant. This step may be implemented by irradiating strong light.

Next, a silicon nitride film 124 is formed in a thickness of 250 nm as an interlayer insulating film by means of plasma CVD. Further, an acrylic resin film 125 is formed by means of spin coating. The acrylic resin film is formed so as to have a thickness of 700 nm at the thinnest part. It is noted that the reason why the resin film is that the surface thereof may be flattened.

Figure 3C:
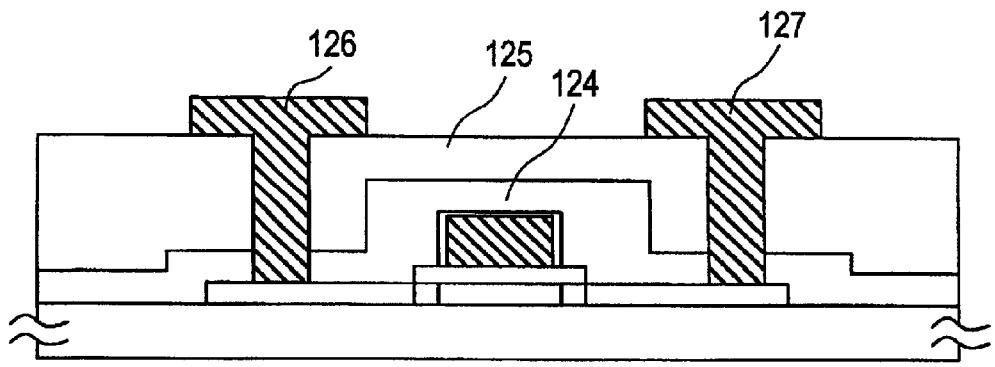

Next, contact holes are created to form a source electrode 126 and a drain electrode 127. Thus, an N-channel type TFT is completed as shown in FIG. 3C.

While the N-channel type TFT has been exemplified above, a P-channel type TFT may be fabricated by doping boron, instead of phosphorus, in the steps in FIGS. 3A and 3B.

Second Embodiment

A case of fabricating an inverted-stagger type TFT will be shown in the present embodiment. In this case, an amorphous silicon film is formed after creating a gate electrode. Then, crystallization is implemented and nickel is removed.

The material of the gate electrode must have resistance to the later heat treatment in case of the present embodiment.

Third Embodiment

Figure 4:
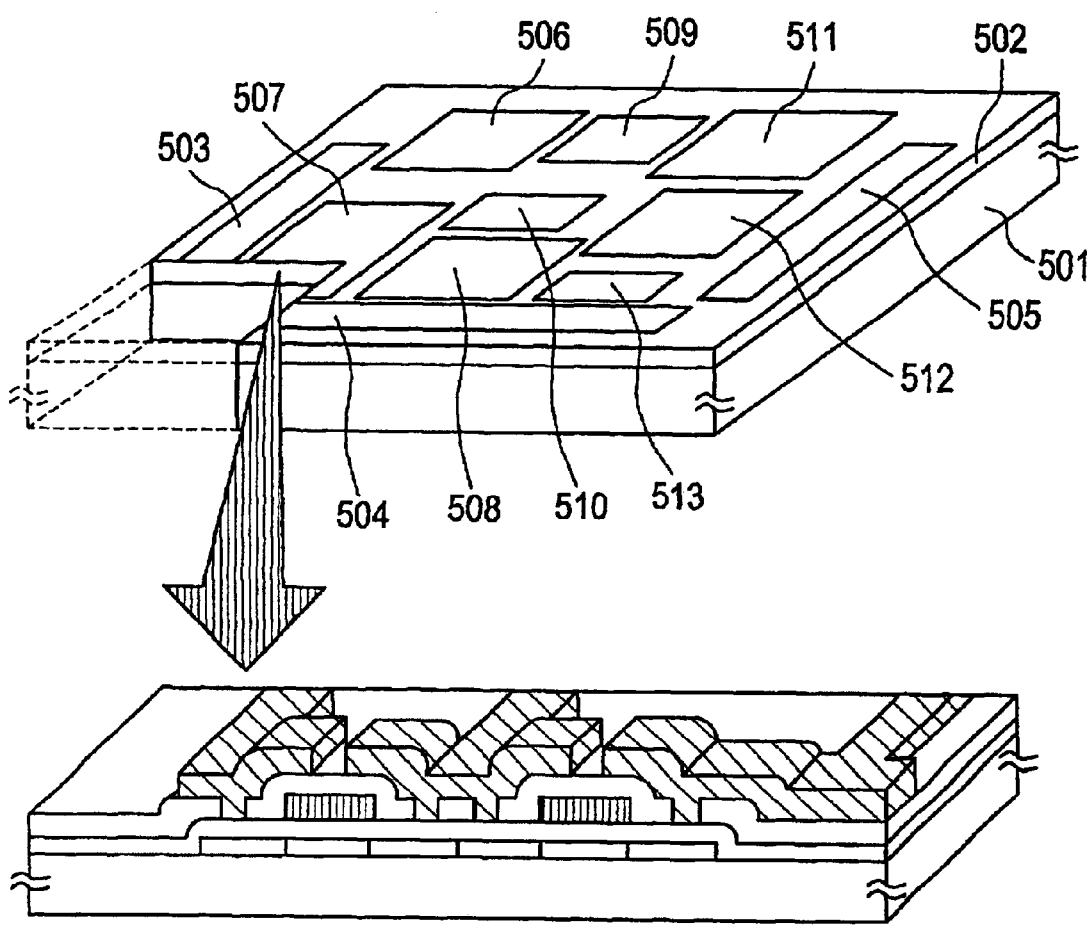
FIG. 4 is a perspective view showing an outline of an integrated circuit utilizing the TFT.

Various devices utilizing the TFT will be exemplified in the present embodiment. FIG. 4 shows one example of a microprocessor of a semiconductor circuit utilizing the TFTs and an enlarged view thereof showing a complementary TFT of an N-type TFT and a P-type TFT.

An insulating film 502 is formed on a ceramic substrate 501 to isolate the substrate from the device. Then, formed thereon are I/O ports 503 through 505, a CPU 506, a cache memory 507, a cache address array 508, a multiplier 509, a circuit 510 containing a real-time clock, a serial interface, a timer and the like, a clock control circuit 511, a cache controller 512 and a bus controller 513.

The thin film transistor disclosed in the present specification may be applied to various flat panel displays and to information processing terminals, video camera and the like equipped with the flat panel display. These devices will be named generically as semiconductor devices in the present specification.

The concrete structure of various devices will be shown below. FIGS. 5A through 5F show various semiconductor devices. These semiconductor devices use the TFT at least partially.

Figure 5A:
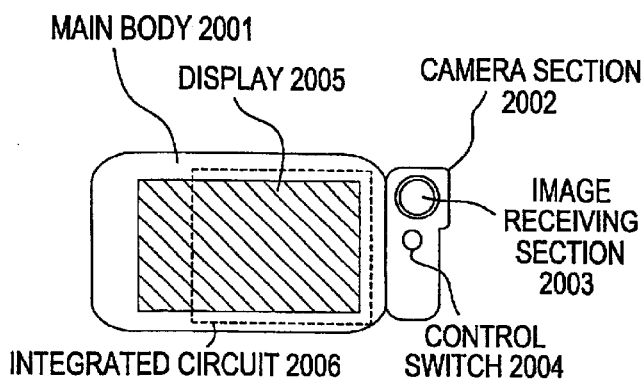
FIGS. 5A through 5F are schematic views of equipments utilizing the TFT.

FIG. 5A shows a portable information processing terminal. The information processing terminal is equipped with an active matrix liquid crystal display or an active matrix EL display and a camera section 2002 for taking in information from the outside. It is also equipped with an integrated circuit 2006 inside. An image receiving section 2003 and a control switch 2004 are disposed in the camera section 2002.

It is considered that the information process terminals will be lightened and thinned more and more in order to improve the portability thereof. In such structure, it is preferable to integrate a peripheral driving circuit, an operation circuit and a memory circuit further on a substrate on which the active matrix display 2005 is formed.

Figure 5B:
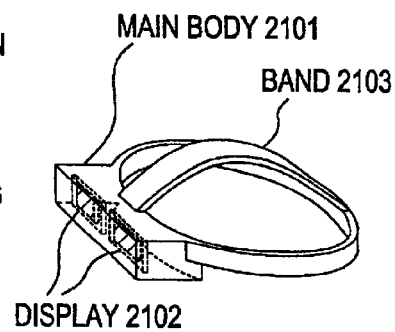

FIG. 5B shows a head-mounted display comprising an active matrix liquid crystal display or an EL display 2102 in a main body 2101. It is arranged so that the main body 2101 can be put on the, head.

Figure 5C:
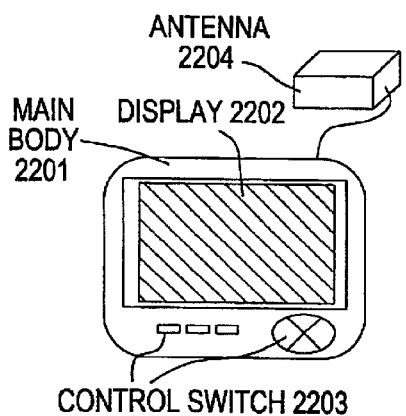

FIG. 5C shows a car navigation system. This equipment has a function of receiving signals from a satellite by an antenna 2204 and of displaying geographical information on an active matrix liquid crystal display 2202 provided in a main body 2201 based on the signals.

An EL type display may be also adopted as the display 2202. In either case, the display is the active matrix flat panel display utilizing the TFT. Control switches 2203 are provided on the main body 2201 so as to be able to manipulate the system in various ways.

Figure 5D:
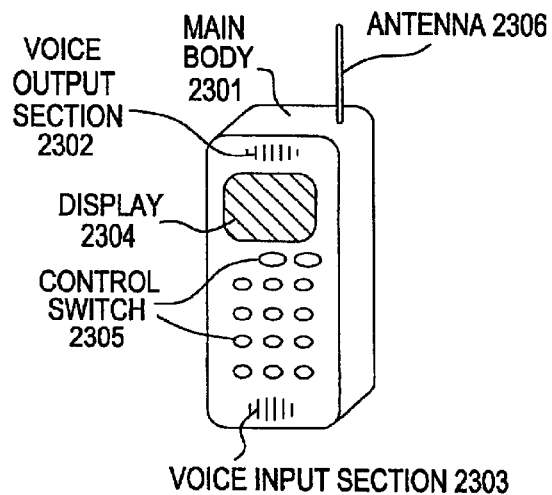

FIG. 5D shows a portable telephone which comprises, on a main body 2301 thereof, an active matrix liquid crystal display 2304, a voice output section 2302, a voice input section 2303, control switches 2305 and an antenna 2306. An equipment in which the portable information processing terminal as shown in FIG. 5A and the portable telephone shown in FIG. 5D are combined is also merchandised in these days.

Figure 5E:
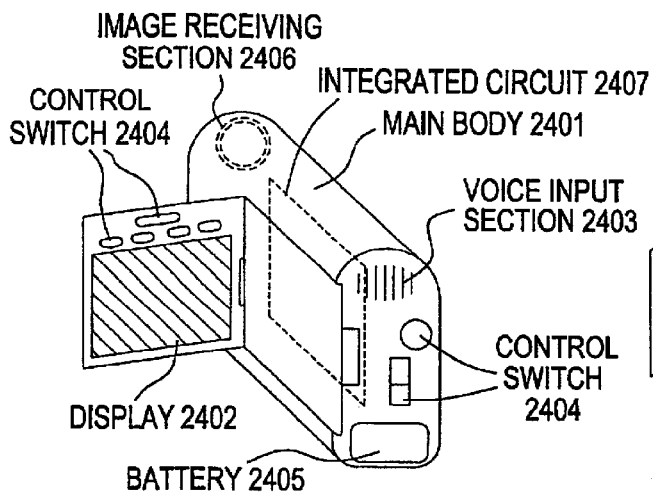

FIG. 5E shows a portable video camera comprising, on a main body 2401 thereof, an active matrix liquid crystal display 2402, a voice input section 2403, control switches 2404, a battery 2405 and an image receiving section 2406.

Figure 5F:
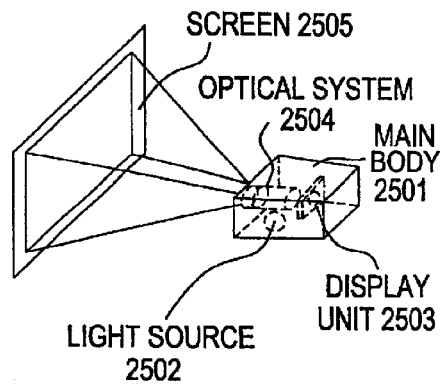

FIG. 5F shows a front type projector comprising a main body 2501, a light source 2502, a display unit 2503, an optical system 2504 and a screen 2505. The present invention is applicable to the display unit 2503.

Although the reflective one has been exemplified as the liquid crystal display 2503 here, it is also possible to use a transmission type liquid crystal display by changing the optical system.

Fourth Embodiment

A case of using a film represented by $Si_xGe_{1-x}$ (0.5<X<1), instead of the silicon film, in the structure of the other embodiment will be shown in the present embodiment.

The present invention allows to use not only simplex of silicon but also a compound film containing silicon as the main substance. The film containing silicon as the main substance is what contains silicon component at least by a half or more.

For example, the amorphous silicon film 102 may be the film represented by $Si_xGe_{1-x}$ (0.5<X<1) in the first embodiment.

Fifth Embodiment

A case of introducing phosphorus not by doping but by forming a silicon film into which phosphorus has been doped in high concentration in the fabrication step shown in FIG. 1C in the first embodiment will be shown.

In this case, the silicon film into which phosphorus has been doped in high concentration is formed by means of plasma CVD after ending the crystallization step shown in FIG. 1B.

Phosphorus is doped by using forming gas in which 98 vol. % of silane and 2 vol. % of phosphine are mixed for example.

Then, when a heat treatment is implemented on the silicon film into which phosphorus has been doped in high concentration after its formation under the same condition with the first embodiment, the nickel element moves into the silicon film.

Although the case of using the silicon film into which phosphorus has been doped in high concentration has been shown here, it is also possible to use a PSG film and the like.

Sixth Embodiment

The present embodiment pertains to a scheme of side-etching the side of the active layer pattern 111 after forming the pattern 111 by using the mask 103 as shown in FIG. 2B in the fabrication steps shown in the first embodiment.

The pattern 111 becomes the active layer of the TFT in the scheme shown in the first embodiment. In this case, phosphorus is doped into the peripheral portion of the pattern 111 which is adjacent to the region 108 from which nickel has been drawn out. Therefore, there is a possibility that phosphorus and nickel exist relatively in high concentration in the peripheral portion of the pattern 111.

Then, the side face of the pattern 111 is side-etched after finishing the patterning shown in FIG. 2B in the present embodiment. Thereby, the above-mentioned apprehension may be eliminated and the reliability on the characteristics of the device may be enhanced further.

The present embodiment may be implemented by implementing wet-etching after dry-etching when the method of etching shown in FIG. 2B is dry-etching. When the method of etching shown in FIG. 2B is wet-etching, it is arranged so as to advance the wet-etching further.

As described above, it is possible to provide the technology for suppressing the metal element from adversely affecting the characteristics of the TFT fabricated by using the crystal silicon film obtained by utilizing the metal element which promotes crystallization of silicon by using the invention disclosed in the present specification.

In particular, the invention disclosed in the present specification allows to obtain the significant effects of a) simplifying the processing steps, b) efficiently removing the metal element and c) accommodating to sub-micron patterns by implementing the steps of 1) selectively introducing the metal element for promoting crystallization, 2) selectively doping phosphorus for removing the metal element and c) forming the active layer pattern of the TFT by utilizing one mask.

While the preferred embodiments have been described, variations thereto will occur to those skilled in the art within the scope of the present inventive concepts which are delineated by the following claims.

What is claimed is:

1. A semiconductor device comprising:
   an I/O port comprising a thin film transistor; and
   said thin film transistor comprising:
      a crystalline semiconductor film comprising silicon provided over a substrate; and
      a channel region provided in said crystalline semiconductor film,
   wherein said channel region has at least two directions in each of which a crystal structure of said crystalline semiconductor film continues in said channel region,
   wherein said two directions are a first direction and a second direction which are different from each other and are substantially in parallel with a surface of said substrate,
   wherein a first crystal boundary of said crystalline semiconductor film extends in said first direction in said channel region, and
   wherein a second crystal boundary of said crystalline semiconductor film extends in said second direction in said channel region.

2. A device according to claim 1 wherein said semiconductor device is incorporated into at least one selected from the group consisting of a portable information processing terminal, a head-mounted display, a car navigation system, a portable telephone, a portable video camera and a front type projector.

3. A semiconductor device comprising:
   a CPU comprising a thin film transistor; and
   said thin film transistor comprising:
      a crystalline semiconductor film comprising silicon provided over a substrate; and
      a channel region provided in said crystalline semiconductor film,
   wherein said channel region has at least two directions in each of which a crystal structure of said crystalline semiconductor film continues in said channel region,
   wherein said two directions are a first direction and a second direction which are different from each other and are substantially in parallel with a surface of said substrate,
   wherein a first crystal boundary of said crystalline semiconductor film extends in said first direction in said channel region, and
   wherein a second crystal boundary of said crystalline semiconductor film extends in said second direction in said channel region.

4. A device according to claim 3 wherein said semiconductor device is incorporated into at least one selected from the group consisting of a portable information processing terminal, a head-mounted display, a car navigation system, a portable telephone, a portable video camera and a front type projector.

5. A semiconductor device comprising:
   a cache memory comprising a thin film transistor; and
   said thin film transistor comprising:
      a crystalline semiconductor film comprising silicon provided over a substrate; and
      a channel region provided in said crystalline semiconductor film,
   wherein said channel region has at least two directions in each of which a crystal structure of said crystalline semiconductor film continues in said channel region,
   wherein said two directions are a first direction and a second direction which are different from each other and are substantially in parallel with a surface of said substrate,
   wherein a first crystal boundary of said crystalline semiconductor film extends in said first direction in said channel region, and
   wherein a second crystal boundary of said crystalline semiconductor film extends in said second direction in said channel region.

6. A device according to claim 5 wherein said semiconductor device is incorporated into at least one selected from the group consisting of a portable information processing terminal, a head-mounted display, a car navigation system, a portable telephone, a portable video camera and a front type projector.

7. A semiconductor device comprising:
   a cache address array comprising a thin film transistor; and
   said thin film transistor comprising:
      a crystalline semiconductor film comprising silicon provided over a substrate; and
      a channel region provided in said crystalline semiconductor film
   wherein said channel region has at least two directions in each of which a crystal structure of said crystalline semiconductor film continues in said channel region,
   wherein said two directions are a first direction and a second direction which are different from each other and are substantially in parallel with a surface of said substrate,
   wherein a first crystal boundary of said crystalline semiconductor film extends in said first direction in said channel region, and
   wherein a second crystal boundary of said crystalline semiconductor film extends in said second direction in said channel region.

8. A device according to claim 7 wherein said semiconductor device is incorporated into at least one selected from the group consisting of a portable information processing terminal, a head-mounted display, a car navigation system, a portable telephone, a portable video camera and a front type projector.

9. A semiconductor device comprising:
   a multiplier comprising a thin film transistor; and
   said thin film transistor comprising:
      a crystalline semiconductor film comprising silicon provided over a substrate; and
      a channel region provided in said crystalline semiconductor film,
   wherein said channel region has at least two directions in each of which a crystal structure of said crystalline semiconductor film continues in said channel region,
   wherein said two directions are a first direction and a second direction which are different from each other and are substantially in parallel with a surface of said substrate
   wherein a first crystal boundary of said crystalline semiconductor film extends in said first direction in said channel region, and wherein a second crystal boundary of said crystalline semiconductor film extends in said second direction in said channel region.

10. A device according to claim 9 wherein said semiconductor device is incorporated into at least one selected from the group consisting of a portable information processing terminal, a head-mounted display, a car navigation system, a portable telephone, a portable video camera and a front type projector.

11. A semiconductor device comprising:
a circuit containing a real-time clock, said circuit comprising a thin film transistor; and
said thin film transistor comprising:
a crystalline semiconductor film comprising silicon provided over a substrate; and
a channel region provided in said crystalline semiconductor film,
wherein said channel region has at least two directions in each of which a crystal structure of said crystalline semiconductor film continues in said channel region,
wherein said two directions are a first direction and a second direction which are different from each other and are substantially in parallel with a surface of said substrate,
wherein a first crystal boundary of said crystalline semiconductor film extends in said first direction in said channel region, and
wherein a second crystal boundary of said crystalline semiconductor film extends in said second direction in said channel region.

12. A device according to claim 11 wherein said semiconductor device is incorporated into at least one selected from the group consisting of a portable information processing terminal, a head-mounted display, a car navigation system, a portable telephone, a portable video camera and a front type projector.

13. A semiconductor device comprising:
a circuit containing a serial interface, said circuit comprising a thin film transistor; and
said thin film transistor comprising:
a crystalline semiconductor film comprising silicon provided over a substrate; and
a channel region provided in said crystalline semiconductor film,
wherein said channel region has at least two directions in each of which a crystal structure of said crystalline semiconductor film continues in said channel region,
wherein said two directions are a first direction and a second direction which are different from each other and are substantially in parallel with a surface of said substrate,
wherein a first crystal boundary of said crystalline semiconductor film extends in said first direction in said channel region, and
wherein a second crystal boundary of said crystalline semiconductor film extends in said second direction in said channel region.

14. A device according to claim 13 wherein said semiconductor device is incorporated into at least one selected from the group consisting of a portable information processing terminal, a head-mounted display, a car navigation system, a portable telephone, a portable video camera and a front type projector.

15. A semiconductor device comprising:
a circuit containing a timer, said circuit comprising a thin film transistor; and
said thin film transistor comprising:
a crystalline semiconductor film comprising silicon provided over a substrate; and
a channel region provided in said crystalline semiconductor film,
wherein said channel region has at least two directions in each of which a crystal structure of said crystalline semiconductor film continues in said channel region,
wherein said two directions are a first direction and a second direction which are different from each other and are substantially in parallel with a surface of said substrate,
wherein a first crystal boundary of said crystalline semiconductor film extends in said first direction in said channel region, and
wherein a second crystal boundary of said crystalline semiconductor film extends in said second direction in said channel region.

16. A device according to claim 15 wherein said semiconductor device is incorporated into at least one selected from the group consisting of a portable information processing terminal, a head-mounted display, a car navigation system, a portable telephone, a portable video camera and a front type projector.

17. A semiconductor device comprising:
a clock control circuit comprising a thin film transistor; and
said thin film transistor comprising:
a crystalline semiconductor film comprising silicon provided over a substrate; and
a channel region provided in said crystalline semiconductor film
wherein said channel region has at least two directions in each of which a crystal structure of said crystalline semiconductor film continues in said channel region,
wherein said two directions are a first direction and a second direction which are different from each other and are substantially in parallel with a surface of said substrate,
wherein a first crystal boundary of said crystalline semiconductor film extends in said first direction in said channel region, and
wherein a second crystal boundary of said crystalline semiconductor film extends in said second direction in said channel region.

18. A device according to claim 17 wherein said semiconductor device is incorporated into at least one selected from the group consisting of a portable information processing terminal, a head-mounted display, a car navigation system, a portable telephone, a portable video camera and a front type projector.

19. A semiconductor device comprising:
a cache controller comprising a thin film transistor; and
said thin film transistor comprising:
a crystalline semiconductor film comprising silicon provided over a substrate; and
a channel region provided in said crystalline semiconductor film,
wherein said channel region has at least two directions in each of which a crystal structure of said crystalline semiconductor film continues in said channel region,
wherein said two directions are a first direction and a second direction which are different from each other and are substantially in parallel with a surface of said substrate, wherein a first crystal boundary of said crystalline semiconductor film extends in said first direction in said channel region, and wherein a second crystal boundary of said crystalline semiconductor film extends in said second direction in said channel region.

20. A device according to claim 19 wherein said semiconductor device is incorporated into at least one selected from the group consisting of a portable information processing terminal, a head-mounted display, a car navigation system, a portable telephone, a portable video camera and a front type projector.

21. A semiconductor device comprising:

a bus controller comprising a thin film transistor; and said thin film transistor comprising:

a crystalline semiconductor film comprising silicon provided over a substrate; and a channel region provided in said crystalline semiconductor film, wherein said channel region has at least two directions in each of which a crystal structure of said crystalline semiconductor film continues in said channel region, wherein said two directions are a first direction and a second direction which are different from each other and are substantially in parallel with a surface of said substrate, wherein a first crystal boundary of said crystalline semiconductor film extends in said first direction in said channel region, and wherein a second crystal boundary of said crystalline semiconductor film extends in said second direction in said channel region.

22. A device according to claim 21 wherein said semiconductor device is incorporated into at least one selected from the group consisting of a portable information processing terminal, a head-mounted display, a car navigation system, a portable telephone, a portable video camera and a front type project.

* * * * *